United States Patent
Savin et al.

(10) Patent No.: US 10,651,872 B2
(45) Date of Patent: May 12, 2020

(54) STOPPING CRITERION FOR DECODING QUASI-CYCLIC LDPC CODES

(71) Applicants: COMMISSARIAT A L'ENERGIE ATOMIQUE ET AUX ENERGIES ALTERNATIVES, Paris (FR); POLITECHNICA UNIVERSITY OF TIMISOARA, Timisoara (RO); ECOLE NATIONALE SUPERIEURE DE L'ELECTRONIQUE ET APPLICATIONS (ENSEA), Cergy-Pontoise (FR); CY CERGY PARIS UNIVERSITE, Cergy-Pontoise (FR)

(72) Inventors: Valentin Savin, Grenoble (FR); Oana Boncalo, Timisoara (RO); David Declercq, Ableiges (FR)

(73) Assignees: COMMISSARIAT A L'ENERGIE ATOMIQUE ET AUX ENERGIES ALTERNATIVES, Paris (FR); POLITECHNICA UNIVERSITY OF TIMISOARA, Timisoara (RO); ECOLE NATIONALE SUPERIEURE DE L'ELECTRONIQUE ET APPLICATIONS(ENSEA), Cergy-Pontoise (FR); CY CERGY PARIS UNIVERSITE, Cergy-Pontoise (FR)

( * ) Notice: Subject to any disclaimer, the term of this patent is extended or adjusted under 35 U.S.C. 154(b) by 33 days.

(21) Appl. No.: 15/913,427

(22) Filed: Mar. 6, 2018

(65) Prior Publication Data

US 2018/0262211 A1 Sep. 13, 2018

(30) Foreign Application Priority Data

Mar. 7, 2017 (EP) .................................... 17159697

(51) Int. Cl.
| | | |
|---|---|---|
| *H03M 13/11* | (2006.01) | |
| *H03M 13/00* | (2006.01) | |
| *H04L 1/00* | (2006.01) | |

(52) U.S. Cl.
CPC ...... *H03M 13/1128* (2013.01); *H03M 13/114* (2013.01); *H03M 13/1105* (2013.01);
(Continued)

(58) Field of Classification Search
None
See application file for complete search history.

(56) References Cited

U.S. PATENT DOCUMENTS

| 8,751,912 B1 | 6/2014 | Varnica et al. |
| 2009/0063931 A1* | 3/2009 | Rovini ............... H03M 13/1137 714/758 |

(Continued)

OTHER PUBLICATIONS

European Search Report dated Aug. 11, 2017 in European Application 17 159 697.6, filed on Mar. 7, 2017.
(Continued)

*Primary Examiner* — Justin R Knapp
(74) *Attorney, Agent, or Firm* — Oblon, McClelland, Maier & Neustadt, L.L.P.

(57) ABSTRACT

An in-between layer partial syndrome stopping (IBL-PS) criterion for a layered LDPC decoder. The IBL-PS syndrome is obtained by applying the parity checks ($H_{r,r+1}$) of a couple of a first layer (r) and a second layer (r+1) on the variables after the first layer has been processed and before the second layer is processed by the decoder, the decoding being stopped if said in-between layer syndrome ($s_{r,r+1}$) is satisfied for at least a couple of consecutive layers.

16 Claims, 4 Drawing Sheets

(52) U.S. Cl.
CPC ...... *H03M 13/116* (2013.01); *H03M 13/1111* (2013.01); *H03M 13/616* (2013.01); *H03M 13/6502* (2013.01); *H04L 1/0051* (2013.01); *H04L 1/0057* (2013.01)

(56) References Cited

U.S. PATENT DOCUMENTS

| | | |
|---|---|---|
| 2010/0275088 A1 | 10/2010 | Graef |
| 2013/0061112 A1* | 3/2013 | Chen .................. H03M 13/114 714/758 |
| 2016/0336964 A1 | 11/2016 | Khalil et al. |

OTHER PUBLICATIONS

Marc P.C. Fossorier, et al. "Quasi-Cyclic Low-Density Parity-Check Codes From Circulant Permutation Martrices", IEEE Transactions on Information Theory, vol. 50, No. 8, 2004, 6 pages.

Dale E. Hocevar "A Reduced Complexity Decoder Architecture Via Layered Decoding of LDPC Codes", IEEE SIPS, 2014, 5 pages.

Erick Amador, et al. "On-the-fly Syndrome Check for LDPC Decoders", Sixth International Conference on Wireless and Mobile Communications, ICWMC, 2010, 5 pages.

Andrei Hera, et al. "Analysis and Implementation of On-the-Fly Stopping Criteria for Layered QC LDPC Decoders", Proceedings of the $22^{nd}$ International Conference *"Mixed Design of Integrated Circuits and Systems"*, 2015, 5 pages.

Jiangpeng Li, et al. "Memory Efficient Layered Decoder Design with Early Termination for LDPC Codes", 2011 IEEE International Symposium of Circuits and Systems (ISCAS), 4 pages.

\* cited by examiner

STOPPING CRITERION FOR DECODING QUASI-CYCLIC LDPC CODES

FIELD OF THE INVENTION

The present invention relates to the field of LDPC (Low-Density Parity Check) codes and concerns more particularly an early stopping criterion for decoding Quasi-Cyclic LDPC codes.

BACKGROUND OF THE INVENTION

Low-Density Parity-Check (LDPC) codes have attracted much attention in the past several years due to their outstanding error-correction performance.

Nowadays, LDPC codes are used in several modern communication standards, including G.hn/G.9960 (ITU-T Standard for networking over power lines, phone lines and coaxial cable), IEEE 802.3an (10 Giga-bit/s Ethernet over Twisted pair), IEEE 802.16e (WiMAX standard for microwave communications), IEEE 802.11n-2009 (Wi-Fi standard), CMMB (China Multimedia Mobile Broadcasting), DVB-S2/DVB-T2/DVB-C2 (Digital video broadcasting, 2nd Generation), DMB-T/H (Digital video broadcasting), DOCSIS 3.1 (Data Over Cable Service Interface Specification).

LDPC codes are linear codes characterized by a sparse parity-check matrix H, that is a parity-check matrix in which the number of non-zero elements is relatively small compared to the size M×N of the matrix.

A LDPC code is generally decoded by an iterative message passing algorithm operating on the Tanner graph representing the code. More specifically, the LDPC code can be represented by a bipartite graph comprising a plurality M of check nodes (each check node representing a parity check equation) and a plurality N of variable nodes (each variable node representing a bit of a codeword), a non-zero element in the parity-check matrix being associated to an edge of the graph. The decoding algorithm involves an iterative exchange of information about the likelihood of the bits (e.g. belief propagation algorithm) over the edges of the graph. The decoding algorithm is implemented by check node units or CNUs (corresponding to the parity check equations) and variable node units or VNUs (corresponding to the codeword bits).

In modern communication systems, there is a constant need for increasing the data rate combined with a requirement of reducing power consumption. Iterative decoding of LDPC codes suffers from a high latency issue, stemming from the fact that the decoding iterations need to be performed sequentially, therefore limiting the transmission throughput. In order to reduce latency, it is important to limit the number of decoding iterations that is needed to correct the channel errors. Since the average number of iterations to decode a noisy codeword is typically much smaller than the maximum allowed iterations, especially for long codes, stopping the decoder earlier may lead to significant reduction in latency and energy consumption. Therefore, an important feature of LDPC decoders/decoding methods lies in the criterion used to stop the decoding process, i.e. when it is possible to declare that convergence to the correct codeword has been achieved.

Stopping criteria can be classified in two main categories. The stopping criteria of the first category operate on the soft values of the decoded bits, namely the AP-LLRs (A Posteriori Log-Likelihood Ratios). The stopping criteria of the second category operate on the hard decided bits and perform a parity-check computation.

The stopping criteria of the first category may usually be applied on-the-fly, namely without interrupting the decoding process. However, they lead to residual errors.

By contrast, the stopping criteria of the second category generally require to interrupt the decoding process, to make a hard decision on the AP-LLRs and to calculate the syndrome. They lead to a lower BER at the cost of extra latency, though.

Recently a class of LDPC codes, called QC-LDPC codes (Quasi-Cyclic LDPC codes) or protograph codes, has received considerable attention in the literature. A QC-LDPC code is a LDPC code whose parity-check matrix is defined by blocks of circulant matrices. A detailed description of the QC-LDPC codes can be found in the article of M. Fossorier entitled "Quasi-Cyclic Low-density Parity Check Codes from circulant permutation matrices" published in IEEE Trans. on Information Theory, vol. 50, No. 8, August 2004, pp. 1788-1793. A QC-LDPC code is defined by base matrix B of size R×C having integer elements $b_{r,c} \geq -1$, $\forall r=0, \ldots, R-1$ and $\forall c=0, \ldots, C-1$. The parity check matrix H is obtained by expanding the base matrix by an expanding factor L, each element of B being replaced by square matrix of size L×L as follows:

if $b_{r,c}=-1$, $b_{r,c}$ is replaced with an all-zero matrix $0_{L \times L}$
if $b_{r,c} \geq 0$, $b_{r,c}$ is replaced with a circulant matrix $CS(b_{r,c})$ obtain by right-shifting the rows of the identity matrix $I_{L \times L}$ by $b_{r,c}$ positions (in particular, an element $b_{r,c}=0$ is replaced by $I_{L \times L}$). Equivalently, $b_{r,c}$ is replaced with $J^{b_{r,c}}$ where J is the cyclic permutation matrix of size L×L $$J = \begin{pmatrix} 0 & 0 & \ldots & 0 & 1 \\ 1 & 0 & \ddots & 0 & 0 \\ 0 & \ddots & \ddots & \vdots & \vdots \\ \vdots & \ddots & \ddots & 0 & 0 \\ 0 & 0 & \ldots & 1 & 0 \end{pmatrix}$$

and recalling that $J^0 = I_{L \times L}$. The resulting parity-check matrix H has therefore M=L×R rows and N=L×C columns.

An example of construction of the parity-check matrix H of a QC-LDPC code has been illustrated in FIG. 1. In this example, the base matrix is of size 4×24, the expansion factor being designated by L.

An important feature of a QC-LDPC code is that its parity-check matrix is organized in layers, a layer being defined as set of L consecutive rows of H originating from one row of B. In the following, we denote $H_r$ the sub-matrix of H corresponding to the $r^{th}$ row of B. From the construction of H, it appears that a variable node occurs at most once in a parity check layer $H_r$. Stated differently, if we denote $x_j$, $j=1, \ldots, N$ the bits of a codeword, the parity-check equations corresponding to a layer r do not involve more than once each bit $x_j$. By contrast, the parity-check equations corresponding to two distinct layers of H may involve twice the same bit $x_j$. This layered structure considerably simplifies the hardware of the decoder: all CNUs within one layer may operate in parallel and all messages computed by the CNUs can then be propagated in one pass (one clock cycle) to the VNUs linked thereto for processing the next layer. Hence the message-passing can be performed layer by layer instead of row by row as in a conventional LDPC decoder. This message propagation scheduling, also known more simply as layered scheduling, converges in about half the number of iterations compared to the fully parallel decoder, thus yielding a lower decoding latency. Furthermore, the same processing units (CNUs, VNUs) can be reused to process all the layers of the parity check matrix, thus resulting in an efficient use of the hardware resources. A description of the layered decoder can be found in the article of D. E. Hocevar entitled "A reduced complexity decoder architecture via layered decoding of LDPC codes" published in Proc. of IEEE Workshop on Signal Processing Systems (SIPS), 2004, pp. 107-112.

Stopping criteria designed for decoding LDPC codes can obviously be applied in particular to QC-LDPC codes. Hence, a classical criterion would be to interrupt the decoding at the end of an iteration, once all the layers have been processed, and to calculate the syndrome on the decided word $\hat{x}=(\hat{x}_1, \hat{x}_2, \ldots \hat{x}_N)$, where $\hat{x}_1, \hat{x}_2, \ldots \hat{x}_N$ are the hard-decided bits:

$$s = H\hat{x}^T \quad (1)$$

the syndrome s being represented as a vector of size M. This approach, also called full syndrome approach, leads to a latency overhead since the decoding has to be interrupted. Alternatively, we may consider using an additional hard decision memory for storing the hard-decided bits and performing the syndrome computation while the next iteration is being processed. However, such an implementation would imply additional memory and cost overhead.

Specific stopping criteria have been designed for taking advantage of the hardware architecture of QC-LDPC decoder. More specifically, it has been proposed to use partial syndromes as a measure to stop the decoding.

A partial syndrome, denoted $s_r$, is a vector of size L associated with a layer r, defined by the L parity-check equations within this layer, that is:

$$s_r = H_r \hat{x}^T \quad (2)$$

If all the partial syndromes $s_r$, r=0, ..., R−1 are null, then it is assumed that $\hat{x}$ is a codeword and the decoding stops.

The computation of the partial syndromes can be performed on-the-fly as described by E. Amador et al. in the article entitled "On-the-fly syndrome check for LDPC decoders", published in Proc. 6$^{th}$ Int'l Conf. on Wireless and Mobile Communications (ICWMC), 2010. From an hardware cost point-of-view, the on-the-fly partial syndrome check (also called OTF syndrome) is advantageous since the computation of the sequence of the partial syndromes $s_r$, r=0, ..., R−1 does not increase the decoding latency, contrary to the full syndrome approach.

However, the OTF syndrome stopping criterion may lead to undetected errors. These errors stem from the fact that variable-nodes are updated after each layer is processed. Therefore, even if $s_r=0$, r=0, ..., R−1, these syndromes may be calculated on different hard decision vectors $\hat{x}$. In other words, there is no guarantee that the partial syndromes are satisfied by the same hard decided word. In such instance, the output hard decision vector is not a codeword. Hence, the OTF stopping criterion leads to a dramatic increase of the FER (Frame Error Rate) at medium to high SNR, more precisely in the waterfall region.

The article of A. Hera et al. entitled "Analysis and implementation of the on-the-fly stopping criteria for layered QC LDPC decoders" published in Proc. of the 22$^{nd}$ Int'l Conf. on Mixed *Designs of Integrated Circuits and Systems* (*MIXDES*), Torun, Poland, June 2015, pp. 287-297, reviews the existing on-the-fly criteria for early termination of LDPC decoding and proposes a new criterion (called on-the-fly imprecise parity check or OTF-IPC) to improve the performance of the OTF. The OTF-IPC generalizes the OTF by taking into account a plurality k of consecutive iterations. More specifically, if $s_r^{(l)}$ denotes the partial syndrome calculated on the layer r at the iteration l, the OTF-IPC criterion proposes to stop the decoding when $s_r^{(l)} = s_r^{(l+1)} = \ldots = s_r^{(l+k+l)} = 0_L$, for a plurality $\lambda$ of consecutive layers r=$r_0$, $r_0+1, \ldots, r_0+\lambda$, where $0_L$ is a vector of size L with all-zero elements. By increasing the number k of consecutive iterations, the FER is improved at the cost of higher latency.

The article of J.li et al. entitled "Memory efficient layered decoder design with early termination for LDPC codes", published in Proc. IEEE International Symposium on Circuits and System (ISCAS), 2011, proposes a low complexity early termination strategy for layered decoding based on monitoring the fluctuation of the hard decision vector from one layer to another. The stopping criterion is referred to as sign stability or SS, since the hard decision vector is given by the signs of the AP-LLR values. After processing a given layer, the signs of the newly obtained AP-LLRs are compared to the ones of the previous layer. If this comparison does not yield a sign change, a counter is incremented by 1. Otherwise, if at least one of the signs changes during current layer processing, the counter is reset (set to 0). The stopping condition is satisfied when the counter reaches a value equal to the number of layers.

Even if there is no guarantee that the output hard decision vector is a codeword (since no syndrome check is performed), it turns out that this stopping criterion is safer than the one based on the OTF syndrome, in the sense that it introduces almost no degradation of the error correction performance. However, the SS stopping criterion leads to an increased latency, i.e. it takes longer than the classical full syndrome check to stop decoding, as a high number of decoding iterations is required before the AP-LLR signs completely stop fluctuating.

The purpose of the present application is therefore to propose a new criterion for stopping the decoding of a QC-LDPC code, and more generally of a layered LDPC code, which neither entails memory overhead nor leads to a high latency, this without sacrificing the error rate.

BRIEF DESCRIPTION OF THE INVENTION

The present invention is defined in the appended independent claims. Various advantageous embodiments are defined in the dependent claims.

BRIEF DESCRIPTION OF THE DRAWINGS

The present invention will be better understood from the description of the following embodiments, by way of illustration and in no way limitative thereto:

FIG. 4 shows on the example of FIG. 1 the computation of an in-between layer partial syndrome according to the first embodiment of the invention;

FIG. 5 shows an example of a base matrix of QC-LDPC code allowing the use of a stopping criterion according to a second embodiment of the invention;

FIG. 6 shows on the example of FIG. 5 the computation of an in-between generalized layer partial syndrome according to the second embodiment of the invention;

DETAILED DISCLOSURE OF PARTICULAR EMBODIMENTS

Figure 1:
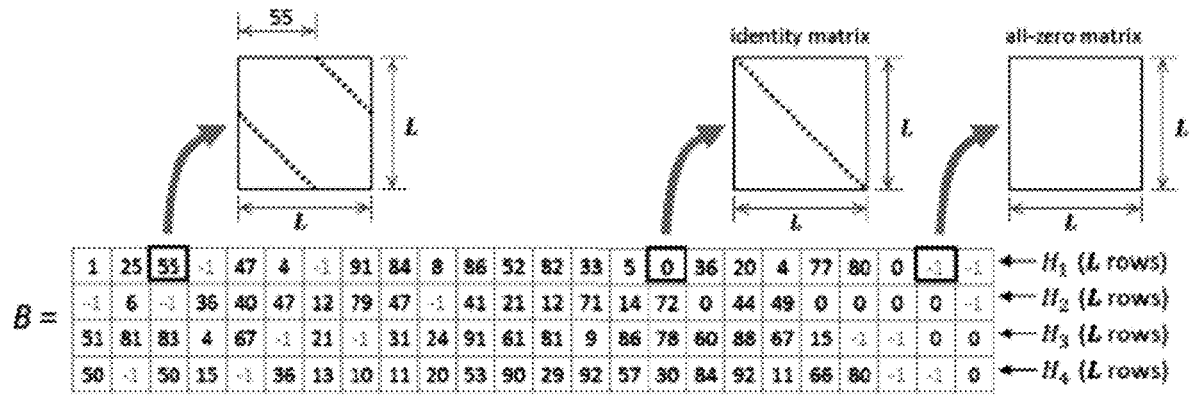
FIG. 1 represents an example of a base matrix for generating the parity-check matrix of a QC-LDPC code.

The present invention applies to a stopping criterion of a layered LDPC decoding method/decoder and more particularly a layered QC-LDPC decoding method/decoder.

In the following, it will be assumed for the sake of simplification but without loss of generality, that the LDPC code is binary, that the code is defined over GF(2). However, it will be clear for the man skilled in art that the invention equally applies to non-binary LDPC codes defined over $GF(2^b)$ where b is an integer such that $b>1$.

The idea underlying the present invention is to propose a new on-the-fly measure for terminating the decoding iterations of a layered LDPC decoder, for example a QC-LDPC decoder. This measure is used for defining a new family of stopping criteria, hereinafter referred to as In-Between Layers Partial Syndrome (IBL-PS).

Basically, the IBL-PS is a partial syndrome defined by two consecutive layers (bilayer). More specifically, if we denote $H_{r,r+1}$ the $2L \times N$ sub-matrix of the parity-check matrix H constituted by the concatenation of the matrices $H_r$ and $H_{r+1}$, for $r=0, \ldots, R-1$ (assuming that the layers are indexed modulo R, i.e. the layer following the layer R-1 is the layer 0), the IBL-PS syndrome between layers r and r+1 is defined as:

$$s_{r,r+1} = H_{r,r+1} \hat{x}_r^T \quad (3)$$

where $\hat{x}_r = (\hat{x}_{r,1}, \hat{x}_{r,2}, \ldots, \hat{x}_{r,N})$ is the hard decision vector (signs of AP-LLRs) after processing layer r and before processing r+1. It is important to understand that the IBL-PS is calculated on the same word (vector $\hat{x}_r$) output by the decoding of layer r. In particular, it should not be confused with the vector $s_r | s_{r+1}$ obtained by concatenating the partial syndromes $s_r = H_r \hat{x}_r^T$ and $s_{r+1} = H_{r+1} x_{r+1}^T$ since these syndromes are calculated on the hard-decided words respectively obtained after processing layer r and r+1, which may differ.

The IBL-PS criterion is defined by:

if $\exists r \in \{0, \ldots, R-1\}$ such that $s_{r,r+1} = 0_{2L}$ decoding stops (4)

More generally, we define a family of stopping criteria involving a plurality of IBL-PS syndromes, denoted IBL-PS($\theta$) where $\theta \geq 1$ defined by:

if $\exists r \in \{0, \ldots, R-1\}$ such that $s_{r,r+1} = s_{r+1,r+2} = \ldots = s_{r+\theta-1,r+\theta} = 0_{2L}$ decoding stops (5)

In other words, if the IBL-PS syndromes calculated for a plurality of $\theta$ consecutive layers are null, then the decoding is stopped.

Within the family of stopping criteria IBL-PS($\theta$), the minimum value for $\theta$ is $\theta=1$, and corresponds to the lowest latency case, since the decoder will stop as soon as any IBL-PS in satisfied. However, increasing the value of $\theta$ will render the stopping criteria safer and safer. It should be noted that values of $\theta$ higher that R are not excluded here: if $\theta > R$, the IBL-PSs $s_{r,r+1} = s_{r+1,r+2} = \ldots = s_{r+\theta-1,r+\theta}$ span more than one decoding iteration. In fact, we will see in the following that the IBL-PS(1) (i.e. IBL-PS) stopping criterion is already safe enough for most QC-LDPC code constructions.

Figure 2:
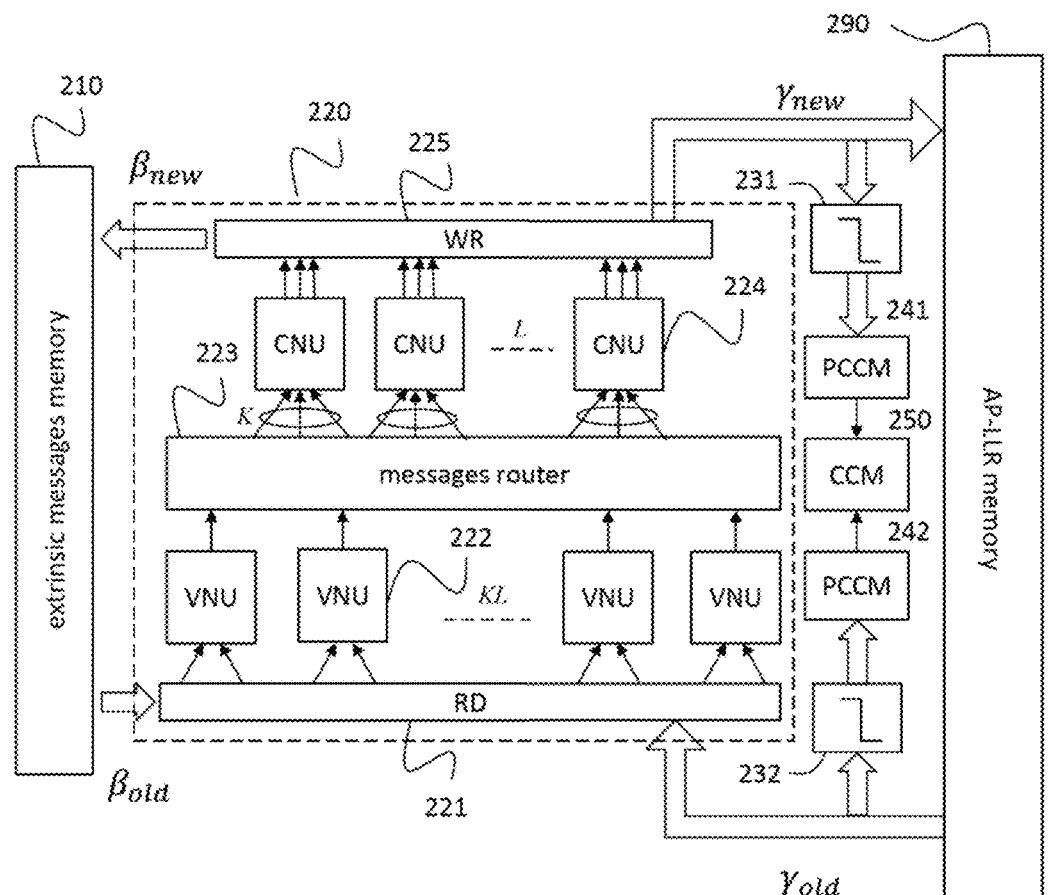
FIG. 2 diagrammatically represents the architecture of a QC-LPDC decoder implementing a stopping criterion according to a first embodiment of the present invention.

FIG. 2 diagrammatically shows the architecture of a QC-LPDC decoder implementing an IBL-PS($\theta$) stopping criterion.

The QC-LDPC decoder comprises an extrinsic messages memory, 210, storing the extrinsic messages sent by the check nodes. A check node provides for each bit node connected thereto an estimate (in form of a LLR value) of the bit in question. Hence, the extrinsic messages memory is of size $M \times K$, where K is the number of elements greater than $-1$ in a row r of the base matrix B, in other words the number of "1s" in a row of the sub-matrix $H_r$ (if the code is irregular, K is the highest number of "1s" over the R rows), or the valency of the check nodes in $\Gamma_r$. Each row m of the memory contains K messages to be sent to the K variable nodes involved in the $m^{th}$ row of parity matrix H.

The QC-LDPC decoder also comprises an AP-LLR memory, 290, storing the estimates a posteriori (as LLR values) of the bits of the word to be decoded. These AP-LLR values are updated after processing each layer. They are obtained by adding the estimates a priori fed to the layer processor 220 and the extrinsic messages output by the same processor after the layer has been processed.

The layer processor 220 comprises a reading unit 221 reading the AP-LLR values from memory 290 and the extrinsic values from memory 210, and feeding the same to a plurality of K×L variable node units VNUs, 222. It will be understood that only the K×L AP-LLR values corresponding to the K×L nodes need to be read from memory 290. Each VNU has two inputs, one inputting the value of the corresponding AP-LLR, read from the AP-LLR memory, 290, and one inputting the extrinsic message from the unique check-node it is connected to in the current layer. The VNUs compute the node messages and send them to the CNUs they are connected to, via router 223. The router 223 routes the node messages to the check nodes over the edges of graph $\Gamma_r$ (bipartite graph corresponding to $H_r$).

Each CNU, 224, has K inputs and K outputs, the K inputs receive the incoming messages from the respective K VNUs connected to this CNU. Each CNU, 224, calculates the extrinsic values for the variable nodes they are connected to. These extrinsic values are stored in memory 210. They are also added to the estimates a priori to obtain updated AP-LLR values for the bits involved in layer r.

The K×L AP-LLR values written to memory 290 after processing layer r are subjected to hard decision in sign detecting module 231 and a parity check is carried out in 241 with parity check matrix $H_r$. After these AP-LLR values have been stored in memory 290, the K×L AP-LLR values read from memory 290 for processing layer r+1 are subjected to hard decision in sign detecting module 232 and a parity check is carried out in 242 with parity check matrix $H_{r+1}$.

It is important to note that the parity check calculation module 242 and the parity check calculation module 241 are carried out on the same hard decision vector $\hat{x}_r$, respectively after layer r has been processed and before layer r+1 is processed.

More specifically, the parity check calculation modules 241 and 242 respectively calculate the partial syndromes:

$$s_{r+1}{}^{ant} = H_{r+1}\hat{x}_r^T \quad (6\text{-}1)$$

$$s_r = H_r \hat{x}_r^T \quad (6\text{-}2)$$

If all the elements of $s_r$ and all the elements of $s_{r+1}{}^{ant}$ are null (hence if $s_{r,r+1}=0_{2L}$), the calculation control module (CCM) 250 increments a counter, referred to as IBL-PS counter. If one element of $s_r$ or $s_{r+1}{}^{ant}$ is non-null, the IBL-PS counter is reset to zero. Once the counter has reached the value θ, the CCM stops the decoding. In case a simple IBL-PS is implemented, no counter is needed and the CCM stops the decoding as soon as the syndromes $s_r$ et $s_{r+1}{}^{ant}$ are null.

Once the decoding has ended, a hard decision is made on the AP-LLR values stored in memory 290, and the resulting codeword is output.

In FIG. 2, the hardware architecture of the layer processor 220 is entirely parallel in the sense that all the variable node units send their messages to the control node units at the same time. However, alternatively, a hardware architecture corresponding to a fully sequential processing in L steps (each step involving one CNU and K VNUs sending their messages to the CNU) may be envisaged. A mixed parallel/sequential architecture can equally be considered. The man skilled in the art will be able to design the appropriate architecture achieving the desired trade-off between complexity and latency, without departing from the scope of protection of the present invention.

It should also be noted that a single sign detecting module can be used instead of the distinct sign detecting modules 231-232. Similarly, a single parity check calculation module can be used instead of PCCM modules 241-242. Indeed, the sign detection and the parity calculation can be performed sequentially in two steps, the first step involving the K×L AP-LLR values (elements of x) after processing layer r and the second step involving the K×L AP-LLR values read for processing layer r+1.

Figure 3:
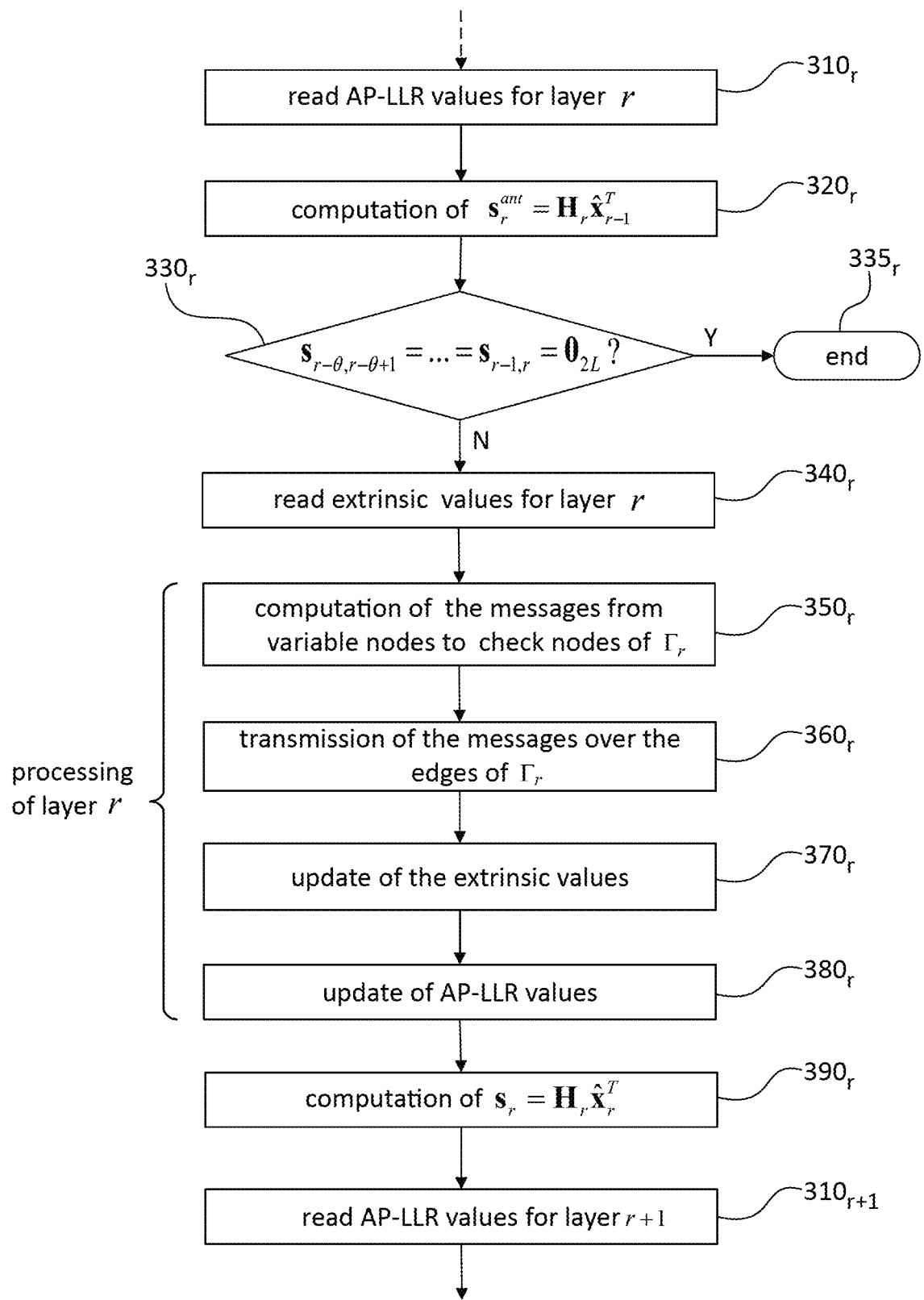
FIG. 3 schematically represents a flow chart of a method for decoding a QC-LDPC code which uses a stopping criterion according to the first embodiment of the present invention.

FIG. 3 schematically represents a flow chart of a method for decoding a QC-LDPC code which uses an IBL-PS (θ) stopping criterion according to a first embodiment of the present invention.

More precisely, for the sake of simplicity only the part of the flow chart concerning layer r has been represented.

At step 310$_r$, the AP-LLR values corresponding to the variables involved in layer r are read from the AP-LLR memory. The soft values of the bits involved in parity-check sub-matrix $H_r$, estimated by layer r−1 are used as a priori estimates for processing layer r.

The partial syndrome $s_r{}^{ant} = H_r \hat{x}_{r-1}^T$ is then calculated at 320$_r$.

At step 330$_r$, it is checked whether θ null consecutive in-between layer partial syndromes have been obtained, i.e. whether $s_{r-\theta,r-\theta+1} = \cdots = s_{r-1,r} = 0_{2L}$.

More specifically, if both $s_{r-1} = H_{r-1}\hat{x}_{r-1}^T$ and $s_r{}^{ant} = H_r \hat{x}_{r-1}^T$ are null, in other words, if the IBL-PS syndrome $s_{r-1,r} = H_{r-1,r} x_{r-1}^T = s_{r-1}|s_r{}^{ant} = 0_{2L}$, the IBL-PS counter is incremented. In the negative, the IBL-PS counter is reset. If the IBL-PS counter equals θ, the decoding ends in 335$_r$. If not, layer r is processed.

At step 340$_r$, the extrinsic values, namely the messages from the check-nodes sent to the variable nodes involved in layer r are read from the extrinsic message memory.

At step 350$_r$, the variable nodes of $\Gamma_r$ (associated with the variables involved in layer r) compute the messages to be sent to the check nodes of $\Gamma_r$.

At step 360$_r$, the messages are sent from the variable nodes to the check nodes along the edges of $\Gamma_r$.

At step 370$_r$, the check nodes of $\Gamma_r$ update the extrinsic values from the messages they have received from the variable nodes of $\Gamma_r$.

At step 380$_r$, the AP-LLR values of the variables involved in layer r are updated.

Finally, at step 390$_r$, the partial syndrome $s_r = H_r \hat{x}_r^T$ is calculated. This partial syndrome is used later on for calculating the IBL-PS syndrome $s_{r,r+1}$ between layer r and r+1.

At step 310$_{r+1}$, the next layer r+1 is taken into account and the AP-LLR values corresponding to the variables involved in layer r+1 are read from the AP-LLR memory.

The decoding of the QC-LDPC code proceeds further on, the next IBL-PS syndrome to be computed concerning bilayer r,r+1, i.e. $s_{r,r+1} = H_{r,r+1}\hat{x}_r^T = s_r|s_{r+1}{}^{ant}$.

Figures 4, 5, 6:
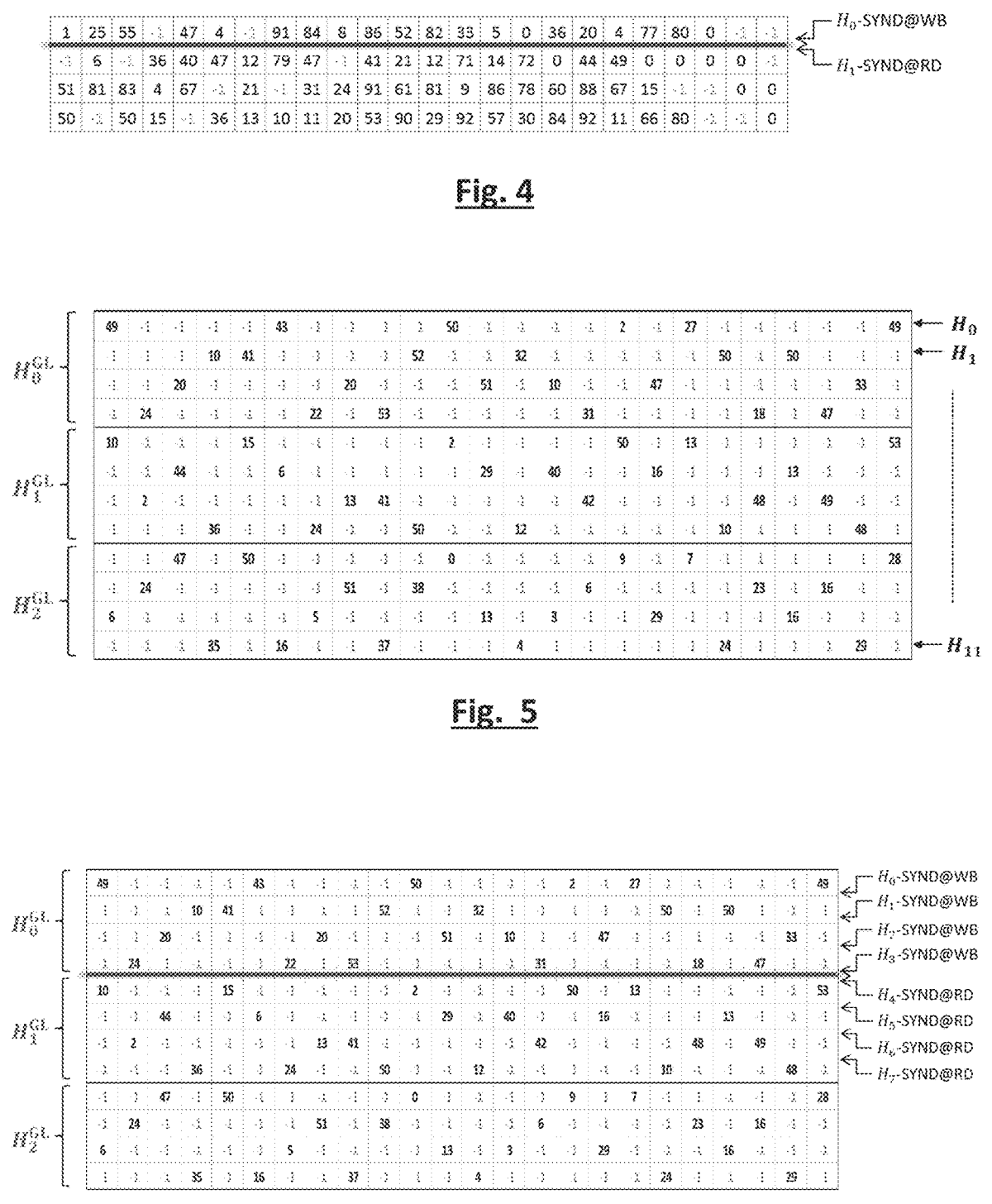

The IBL-PS computation has been illustrated in the example shown in FIG. 4. This figure shows the base matrix B of a QC-LDPC code. It is recalled that the rows of B correspond to the layers of H. Hence, after the first layer (r=0) has been processed, i.e. when the updated AP-LLR values are written in the memory 290 (designated by $H_0$–SYND @ WB) and before the second layer is processed (r=1), i.e. when the AP-LLR values are read from memory 290 (designated by $H_1$–SYND @ RD), the IBL-PS syndrome $s_{0,1}$ is calculated between layers 0 and 1.

In the above description of the IBL-PS stopping criterion, we have assumed that the layers taken into account were consecutive. However, it is possible to order the layers in a different way or even to skip some layers, thereby restricting the calculation of the IBL-PS syndromes to a subset of layers only.

Such a case arises for example when the girth of the parity check sub-matrix $H_{r,r+1}$ (i.e. the length $g_{r,r+1}$ of the shortest cycle within the Tanner graph $\Gamma_{r,r+1} = \Gamma_r \cup \Gamma_{r+1}$ corresponding to $H_{r,r+1}$) lies below a predetermined threshold value, $g_{min}$. It is recalled that the lower is the girth of a bipartite graph, the less reliable is the message-passing decoding (the decoding being then prone to undetected errors).

For example we may define a subset of layers $\mathfrak{R}_{IBL\text{-}PS} \subset \{0, \ldots, R-1\}$ for which $\forall r \in \mathfrak{R}_{IBL\text{-}PS}\ g_{r,r+1} \geq g_{min}$. The layers $r \in \mathfrak{R}_{IBL\text{-}PS}$ are flagged off-line in the decoder (e.g. their indices are stored in a ROM of the decoder) and the IBL-PS stopping criterion is restricted to this subset of layers. The thus restricted IBL-PS criterion can be expressed as:

$$\text{if } \exists r \in \mathfrak{R}_{IBL\text{-}PS} \text{ such that } s_{r,r+1} = 0_{2L} \text{ decoding stops} \quad (7)$$

For the IBL-PS stopping criterion, that is for θ=1, $g_{min}$ is advantageously chosen equal to 12.

More generally, the IBL-PS(θ) stopping criterion may be restricted to $\mathfrak{R}_{IBL\text{-}PS}$:

$$\text{if } \exists r \in \mathfrak{R}_{IBL\text{-}PS} \text{ such that } s_{r,r+1} = s_{r+1,r+2} = \cdots = s_{r+\theta-1,r+\theta} = 0_{2L} \text{ decoding stops} \quad (8)$$

The restricted IBL-PS(θ) stopping criterion can be implemented by incrementing the IBL-PS counter only when there is $r \in \mathfrak{R}_{IBL\text{-}PS}$ such that $s_{r,r+1}=0$, the rest of the implementation remaining unchanged.

Alternatively, instead of skipping the bilayers exhibiting a girth smaller than the predetermined threshold $g_{min}$, they may be weighted with a weight lower than those exhibiting a girth higher that this threshold. In such instance, the IBL-PS counter is incremented by a higher value when the IBL-PS syndrome is verified on a bilayer r,r+1 verifying $g_{r,r+1} \geq g_{min}$.

So far, the proposed stopping criterion IBL-PS(θ) was assumed to operate at the layer level, with one layer corresponding to one row of the base matrix B.

In the following, we define a Generalized Layer (GL) as a set GL of consecutive rows of B that do not overlap with each other, meaning that any column of B has at most one non-negative element within the rows of a GL. Equivalently, a generalized layer GL can be defined as a set of $R_L$ consecutive layers in H where each and every variable appears at most once. In other words, if we denote $H^{GL}$ the sub-matrix of H restricted to the set of layers GL, the sets of predecessors of the respective $R_L \times L$ check nodes in the bipartite graph $\Gamma^{GL}$ representing $H^{GL}$ are disjoint. Stated differently, $\Gamma^{GL}$ is a graph having $R_L \times L$ non-trivial connected components.

An example of the base matrix B of a QC-LDPC code having R=12 layers and $R_{GL}$=3 generalized layers is shown in FIG. 5. In the example illustrated, the generalized layers all have the same size (or thickness) $R_L$=4. However, it should be noted that, in general, the GLs need not be of same size, meaning that different GLs may comprise different number of layers (rows of B). If we denote $R_L^k$ the sizes of the GLs k=0, . . . , $R_{GL}$−1, we then have:

$$M = L \sum_{k=0}^{R_{GL}-1} R_L^k \qquad (9)$$

Denoting $H_{k,k+1}^{GL}$ the submatrix of H corresponding to the GLs k,k+1, where k=0, . . . , $R_{GL}$−1, we may define the In-Between Generalized Layer Partial Syndrome (IBGL-PS) $s_{k,k+1}^{GL}$ by:

$$s_{k,k+1}^{GL} = H_{k,k+1}^{GL} \hat{x}_k^T \qquad (10)$$

where $\hat{x}_k = (\hat{x}_{k,1}, \hat{x}_{k,2}, \ldots \hat{x}_{k,N})$ is the hard decision vector (signs of AP-LLRs) after processing of the generalized layer k and before processing the generalized layer k+1. Similar to the IBL-PS(θ) stopping criterion, the IBGL-PS(θ) stopping criterion is defined by:

if $\exists k \in \{0, \ldots, R_{GL}-1\}$ such that $s_{k,k+1}^{GL} = s_{k+1,k+2}^{GL} = \ldots = s_{k+\theta-1,k+\theta}^{GL} = 0_{2R_L L}$ decoding stops (11)

Furthermore, as for the restricted the IBL-PS(θ) stopping criterion, the IBGL-PS(θ) may be restricted to the generalized layers k for which the Tanner graph representing $H_{k,k+1}^{GL}$ exhibit a girth $g_{k,k+1}^{GL}$ larger than a predetermined threshold value $g_{min}^{GL}$.

The layered decoder illustrated in FIG. 2 can be extended to a generalized layer decoder.

A generalized layer decoder is a decoder for which parity-checks within one GL of H are processed in parallel, and GLs are processed sequentially. Such a generalized decoder has a similar structure as the one illustrated in FIG. 2, where the layer processor 220 is replaced with a generalized layer processor. If all GLs are of the same size, the layer processor comprises a number of CNUs equal to the number of parity checks in one GL, and then reuse them from one GL to another. At each GL processing, the AP-LLR values are first read from the memory 290 and provided to the appropriate CNUs. After the GL processing is completed, the AP-LLR memory is updated with the newly computed values. The IBGL-PS $s_{k,k+1}^{GL}$ can be computed by evaluating the parity checks ($s_k^{GL,ant} = H_{k+1}^{GL} \hat{x}_k$) with $H_k^{GL}$ when data is written back to the AP-LLR memory (i.e. after processing of GL k, denoted $GL_k$ in the following), and the parity checks ($s_{k+1}^{GL,ant} = H_{k+1}^{GL} \hat{x}_k$) with $H_k^{GL}$ when data is read from the AP-LLR memory (i.e. before processing of $GL_{k+1}$).

The generalized layer decoding method of a QC-LDPC code using an IBGL-PS stopping criterion according to a second embodiment of the invention is similar to the one illustrated in FIG. 3 where layer r is replaced with GL k.

Alternatively, the generalized layer decoding method can be implemented by a layered decoder where the parity-checks are processed and the AP-LLR memory is still updated on a layer basis such as the one illustrated in FIG. 2. In such instance, within a given GL, the AP-LLR memory is updated as many times as the number $R_L$ of layers within the GL. However, since the layers within a given GL do not overlap with each other, it follows that each AP-LLR value is updated at most once within the GL. Consequently, the IBGL-PS can be computed by evaluating the parity checks, layer by layer, for the $R_L$ layers in $H_k^{GL}$ when data output by the layer processor 220 is written back to the AP-LLR memory 290 (i.e. after each layer processing), and also by evaluating those, layer by layer, in $H_{k+1}^{GL}$ when data is read from the AP-LLR memory (i.e. before each layer processing). Hence, for evaluating $s_{k,k+1}^{GL}$ the $R_L$ partial syndromes $s_r = H_r \hat{x}_r^T$, $r \in GL_k$, are computed when the APP-LLR values of the layers $r \in GL_k$ are written in memory 290 and the $R_L$ partial syndromes $s_r^{ant} = H_r \hat{x}_r^T$, $r \in GL_{k+1}$ when the APP-LLR values are read from the same memory.

A QC-LDPC layered decoder using an IBGL-PS stopping criterion may easily accommodate a pipeline architecture, as long as the pipeline depth in the layer processor is less than or equal to the number of layers per GL. Note that in case the pipeline depth is greater than the number of layers per GL, a number of stall clock cycles might be required to ensure correct computation of the IBGL-PS syndrome.

FIG. 6 represents the timing of an IBGL-PS syndrome computation when performed by a layered decoder. The base matrix of the QC-LDPC code is the same as the one shown in FIG. 5.

The timing is shown here for the computation of IBGL-PS syndrome $s_{0,1}^{GL}$.

The partial syndromes $s_r$ for the layers r=0, . . . , 3 of $GL_0$ are calculated when the updated AP-LLR values are written back in the memory 290 (designated by $H_0$-SYND @ WB to $H_3$-SYND @ WB). This computation is performed layer by layer.

The partial syndromes $s_r^{ant}$ for the layers r=4, . . . , 7 of $GL_1$ are calculated when the updated AP-LLR values are read from memory 290 (designated by $H_4$-SYND @ RD to $H_7$-SYND @ RD), before these layers are processed.

Figure 7:
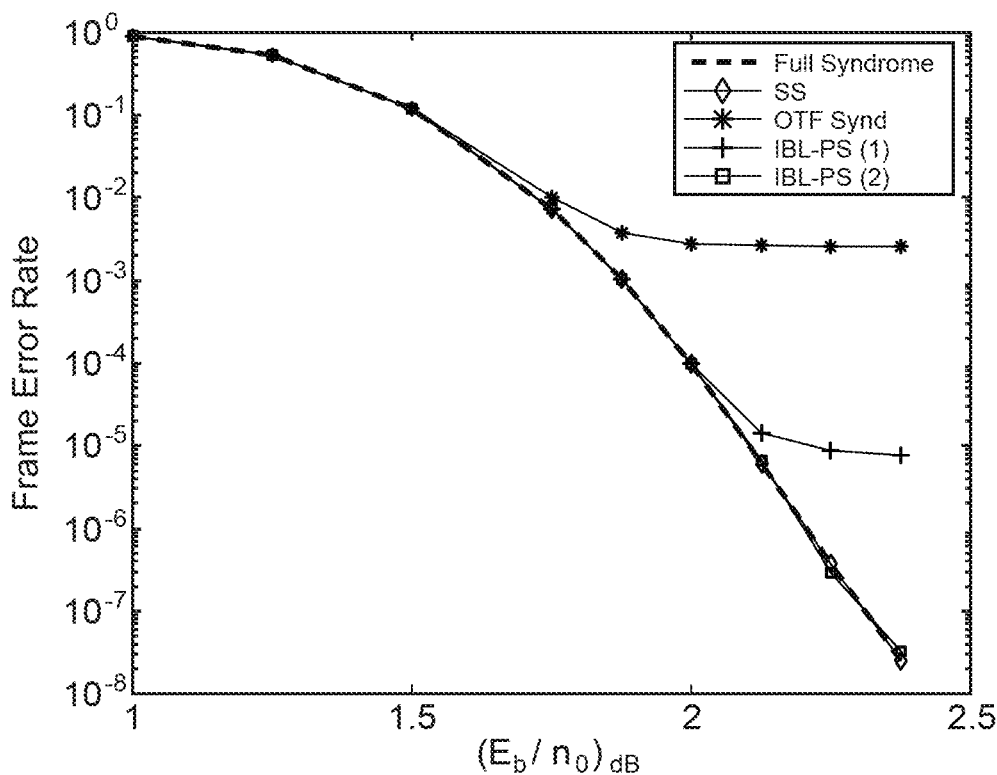
FIG. 7 represents the comparative performance in terms of frame error rate of a method for decoding a QC-LDPC code using examples of stopping criteria according to the invention and examples of stopping criteria known from the prior art.

FIG. 7 represents the performance in terms of error rate of a method for decoding a QC-LDPC code using various examples of stopping criteria.

More specifically, the figure shows the frame error rate (FER) vs. the signal to noise ratio per bit of a (R, C) regular QC-LDPC code with an expansion factor L. In the illustrated example R=3, C=6 and L=128. The base matrix B had an array-type organization i.e. $b_{r,c} \geq 0$, $\forall r=0, \ldots, R-1$ and $\forall c=0, \ldots, C-1$. In other words, the code rate is ½, each row of the parity check matrix H containing 6 "1s" and each column 3 "1s". The code is designed so that the girth $g_{0,1}$ of the first two layers of the code is equal to its maximum value i.e. $g_{0,1}$=12 although the girth of the whole code is g=10.

The curve FER vs. SNR is given for various stopping criteria: a criterion based on the full syndrome (where the decoding is interrupted at the end each iteration and the full syndrome is computed on the hard decided vector), the SS stopping criterion and the OTF syndrome stopping criterion described in the prior art section, the IBL-PS(1) and IBL-PS(2) stopping criteria according to the invention.

A quantized layered Offset Min-Sum (OMS) decoder has been used with a maximum of 50 decoding iterations. We note that the IBL-PS(1) stopping criterion does not introduce any performance loss compared to the full syndrome check until the frame error rate (FER) reaches an error floor at FER$\approx 10^{-5}$. It is worth to note that all frame errors in the error floor of the curves are undetected errors. As a first conclusion from those curves, it appears that the IBL-PS(1) is already safe enough for most practical applications, as it does not introduce undetected errors until a sufficiently low error floor (e.g., low enough for practical applications in wireless communications). It can also be seen that the IBL-PS($\theta$) stopping criterion $\theta=2$ is completely safe, as it does not introduce any degradation of the error correction performance with respect to the full syndrome check. The state-of-the-art OTF criterion is not safe, as it introduces a significant degradation of the error correction performance, while the SS criterion is safe, but requires a higher number of decoding iterations compared to the IBL-PS criteria, as shown further below.

Figure 8:
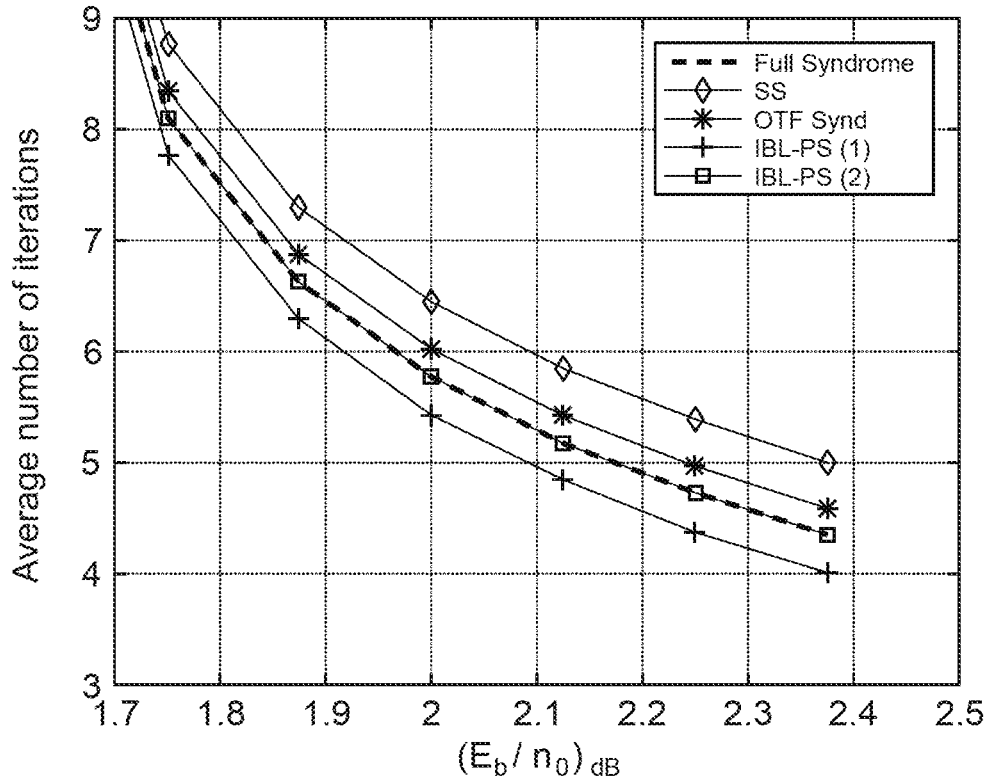
FIG. 8 represents the comparative performance in terms of number of iterations of a method for decoding a QC-LDPC code using examples of stopping criteria according to the invention and examples of stopping criteria known from the prior art.

FIG. 8 represents the performance in terms of number of iterations of a method for decoding a QC-LDPC code using various examples of stopping criteria.

More specifically, the figure shows the average number of decoding iterations performed by the OMS layer decoder for the (3,6)-regular QC-LDPC code (L=128) mentioned above, with the various stopping criteria: IBL-PS(1), IBL-PS(2), OTF, SS, and full syndrome check.

It is recalled that the full syndrome check is not actually an "on the fly" stopping criterion and is only included here for comparison purposes.

From this figure, it can be seen that in the high SNR regime, the IBL-PS(1) and IBL-PS(2) stopping criteria allow for a lower average number of decoding iterations by up to 20% compared to the SS criterion (which is also safe), and up to 13% compared to OTF criterion (which is not safe).

The invention claimed is:

1. A method for decoding an LDPC (low density parity check) code, said code being defined over a GF($2^b$) field, where b≥1, and wherein a parity-check matrix H, said parity-check matrix having a layered structure, each layer comprising one or more consecutive rows of said matrix, each row of H corresponding to a parity check and each column of H corresponding to a variable, each layer of H involving a variable at most once, each layer being represented a bipartite graph $\Gamma_r$ comprising parity check nodes and variable nodes, the decoding of the LDPC code being performed iteratively on the layers of H, each layer being processed in turn until a stopping criterion is met, the processing of a layer comprising message passing between the variable nodes and check nodes of $\Gamma_r$ to update values of the variables, wherein the stopping criterion comprises the computation of an in-between layer partial syndrome ($s_{r,r+1}$) for a couple of consecutive layers constituted by a first layer (r) and a second layer (r+1), the in-between layer partial syndrome being computed by applying parity checks ($H_{r,r+1}$) of said first layer and said second layer on variables ($\hat{x}_r$) after said first layer has been processed and before said second layer is processed, the decoding being stopped if the in-between layer partial syndrome is null for at least one couple of consecutive layers.

2. The method for decoding an LDPC code according to claim 1, wherein said LDPC code is a quasi-cyclic LDPC code, said parity check matrix H being obtained by expanding a base matrix (B) of size R×C by an expansion factor L, each element of the base matrix being replaced with a square matrix of size L×L being either an all-zero matrix ($0_{L\times L}$, or a power of a cyclic permutation matrix ($J_{L\times L}$) of size L×L, whereby the parity check matrix is a matrix of M=L×R rows and N=L×C columns.

3. The method for decoding an LDPC code according to claim 2, wherein all the layers have the same size L.

4. The method for decoding an LDPC code according to claim 2, wherein each layer has a size multiple of L.

5. The method for decoding an LDPC code according to claim 1, wherein the decoding is stopped as soon as the in-between layer partial syndrome of one couple of consecutive layers r,r+1 is null.

6. The method for decoding an LDPC code according to claim 5, wherein the one couple of consecutive layers is selected such that a girth ($g_{r,r+1}$) of the bipartite graph $\Gamma_r \cup \Gamma_{r+1}$ is larger than or equal to a predetermined minimum value ($g_{min}$).

7. The method for decoding an LDPC code according to claim 1, wherein the decoding is stopped as soon as a predetermined number ($\theta$) of in-between layer partial syndromes of couples of consecutive layers are null.

8. The method for decoding an LDPC code according to claim 7, wherein the couples of consecutive layers form a sequence, a couple of the sequence sharing one layer with a preceding couple in said sequence and one layer with a next couple in said sequence.

9. The method for decoding an LDPC code according to claim 7, wherein the couples of consecutives layers r,r+1 are selected such that a girth ($g_{r,r+1}$) of the bipartite graph $\Gamma_r \cup \Gamma_{r+1}$ of each couple of layer is larger than or equal to a predetermined minimum value ($g_{min}$).

10. An LDPC (low density parity check) code decoder, said code being defined over a GF($2^b$) field, where b≥1 and wherein a parity-check matrix H, said parity-check matrix having a layered structure, each layer comprising one or more consecutive rows of said matrix, each row corresponding to a parity check and each column corresponding to a variable, each layer of H involving a variable at most once, each layer being represented a bipartite graph $\Gamma_r$ comprising parity check nodes and variable nodes, the decoder comprising a layer processor, a first memory for storing extrinsic messages of check nodes and a second memory for storing soft estimates of a word to be decoded, said layer processor comprising variable node units and check node units, each variable node unit being associated with a variable node of $\Gamma_r$ and each check node unit being associated with a check node of $\Gamma_r$, the variable node units sending variable node messages to the check node units along edges of graph $\Gamma_r$, the variable node units computing said variable node messages from a word estimate read out from the second memory and extrinsic check node messages read out from the first memory, and the check node units updating the word estimate and said extrinsic messages, based on the variable node messages they have received, wherein the LDPC decoder further comprises a control unit, an in-between layer partial syndrome calculation unit calculating a first partial syndrome ($s_r$) by applying parity checks ($H_r$) of a first layer (r) having been processed by the layer processor on the updated word estimate and a second partial syndrome ($s_{r+1}^{ant}$) by applying the parity checks ($H_{r+1}$) of a second layer (r+1), consecutive to the first layer, to the same word estimate, said control unit stopping the decoder if the in-between layer partial syndrome is null for at least one couple of consecutive layers.

11. The LDPC code decoder as claimed in claim 10, wherein the first partial syndrome is calculated on said updated word estimate when it is written in said second memory and the second partial syndrome is calculated on the same word estimate when it is read out from said memory.

12. The LDPC code decoder as claimed in claim 10, wherein said LDPC code is a quasi-cyclic LDPC code, said parity check matrix H being obtained by expanding a base matrix (B) of size R×C by an expansion factor L, L×L, whereby the parity check matrix is a matrix of M=L×R rows and N=L×C columns, all the layers having the same size L and the layer processor comprising exactly L check node units.

13. The LDPC code decoder as claimed in claim 10, wherein said LDPC code is a quasi-cyclic LDPC code, said parity check matrix H being obtained by expanding a base matrix (B) of size R×C by an expansion factor L, L×L, whereby the parity check matrix is a matrix of M=L×R rows and N=L×C columns, all the layers having a size multiple of L and the layer processor comprising exactly L check node units.

14. The LDPC code decoder as claimed in claim 10, wherein the control unit stops the decoder as soon as the in-between layer partial syndrome of one couple of consecutive layers r,r+1 is satisfied.

15. The LDPC code decoder as claimed in claim 10, wherein the control unit comprises a counter, said counter being incremented each time an in-between layer partial syndrome is satisfied, and reset each time it is not, the control unit stopping said decoder as soon as the counter reaches a predetermined number ($\theta$).

16. A method for decoding an LDPC code, said code being defined over a $GF(2^b)$ field, where $b \geq 1$, and wherein a parity-check matrix H, said parity-check matrix having a layered structure, each layer comprising one or more consecutive rows of said matrix, each row of H corresponding to a parity check and each column of H corresponding to a variable, each layer of H involving a variable at most once, each layer being represented a bipartite graph $\Gamma_r$ comprising parity check nodes and variable nodes, the decoding of the LDPC (low density parity check) code being performed iteratively on the layers of H, each layer being processed in turn until a stopping criterion is met, the processing of a layer comprising message passing between the variable nodes and check nodes of $\Gamma_r$ to update values of the variables, wherein the stopping criterion comprises the computation of an in-between layer partial syndrome ($s_{r,r+1}$) for consecutive layers constituted by at least a first layer (r) and a second layer (r+1), the in-between layer partial syndrome being computed by applying parity checks ($H_{r,r+1}$) of said first layer and said second layer on variables ($\hat{x}_r$) after said first layer has been processed and before said second layer is processed, the decoding being stopped if the in-between layer partial syndrome is null for at least a plurality of consecutive layers.

* * * * *